US010044351B2

(12) United States Patent
Jensen (10) Patent No.: US 10,044,351 B2
(45) Date of Patent: Aug. 7, 2018

(54) SOLID STATE SWITCH RELAY

(71) Applicant: BANG & OLUFSEN A/S, Struer (DK)

(72) Inventor: Jørgen Selmer Jensen, Hjerm (DK)

(73) Assignee: BANG & OLUFSEN A/S, Struer (DK)

(*) Notice: Subject to any disclaimer, the term of this patent is extended or adjusted under 35 U.S.C. 154(b) by 0 days.

(21) Appl. No.: 15/522,195

(22) PCT Filed: Nov. 20, 2015

(86) PCT No.: PCT/EP2015/077188
§ 371 (c)(1),
(2) Date: Apr. 26, 2017

(87) PCT Pub. No.: WO2016/083251
PCT Pub. Date: Jun. 2, 2016

(65) Prior Publication Data
US 2018/0006641 A1 Jan. 4, 2018

(30) Foreign Application Priority Data

Nov. 24, 2014 (DK) .................................. 2014 00681

(51) Int. Cl.
*H03K 17/16* (2006.01)
*H03F 3/183* (2006.01)
(Continued)

(52) U.S. Cl.
CPC ........... *H03K 17/162* (2013.01); *G05F 3/262* (2013.01); *H03F 3/183* (2013.01); *H03F 3/21* (2013.01);
(Continued)

(58) Field of Classification Search
CPC .. H03K 17/162; H03K 17/163; H03K 17/168; H03K 3/354; H03K 5/01;
(Continued)

(56) References Cited

U.S. PATENT DOCUMENTS

| 5,627,489 A * | 5/1997 | Jochum | H03K 19/00384 |
| | | | 323/315 |
| 2002/0135415 A1* | 9/2002 | Dufort | H03K 17/04123 |
| | | | 327/333 |

FOREIGN PATENT DOCUMENTS

EP  2448120 A1  5/2012
JP  2011015136 A  1/2011

OTHER PUBLICATIONS

International Search Report and Written Opinion for PCT/EP2015/077188 filed Nov. 20, 2015 (published as WO 2016083251 on Jun. 2, 2016) which is the parent application to the instant application, dated Feb. 3, 2016, 10 pages.

* cited by examiner

*Primary Examiner* — John Poos
(74) *Attorney, Agent, or Firm* — Harness, Dickey & Pierce, P.L.C.; Anthony G. Fussner (57) ABSTRACT

A solid state relay and a method for controlling a signal path between an AC-signal output and a load in a power amplifier assembly are disclosed. The relay comprises a first and a second MOSFET having a common gate junction, a common source junction and wherein and wherein a drain terminal of a first MOSFET and a drain terminal of a second MOSFET form relay terminals. The solid state relay further comprises a control circuit comprising a positive side comprising a first controlled current generator configured to provide a first control current to the gate junction, and a negative side comprising a current mirror circuit configured to sink a second current from the source junction. Hereby, a generic solid state speaker relay has been disclosed. The relay performs up to the most stringent demands regarding pop/click on high quality products. It can be used to ground wire break, hot wire break and BTL (Bridge Tied Load)

(Continued)

break. The design is rather tolerable to different MOSFETs and very competitive in quality and price.

5 Claims, 7 Drawing Sheets

(51) Int. Cl.
*G05F 3/26* (2006.01)
*H03F 3/21* (2006.01)

(52) U.S. Cl.
CPC .. *H03F 2200/03* (2013.01); *H03K 2217/0009* (2013.01)

(58) Field of Classification Search
CPC .. H03K 5/04; H03F 3/183; H03F 3/21; H03F 2200/03; G05F 3/262
USPC .............. 327/108, 109, 110, 111, 112, 333
See application file for complete search history.

SOLID STATE SWITCH RELAY

This patent application is a U.S. national stage filing under 35 U.S.C. § 371 of International Application No. PCT/EP2015/077188 filed Nov. 20, 2015, which claims priority of Denmark Application No. PA201400681 filed Nov. 24, 2014. The disclosures of the applications identified in this paragraph are incorporated herein by reference in their entirety.

TECHNICAL FIELD OF THE INVENTION

The present invention relates to loudspeaker relays, and more specifically to solid state loudspeaker relay.

BACKGROUND

Solid state switches or relays have been used for decades for various audio applications, an example of this type of circuitry is disclosed, e.g. in U.S. Pat. No. 4,438,356. Moreover, the use of solid state relays for mute purposes is not new. It has for example been used for muting hybrid amplifiers in order to avoid excessive pop/click. A known application is in the B&O (Bang & Olufsen) product "Beo-Lab5" where it was used to mute the ICEpower™ amplifier to suppress pop/click.

Although a significant improvement, present prior art designs still suffer from some drawbacks. For example, one concern is that the known designs result in a minor pop/click at the speaker(s) coming from the control circuit. This pop/click is actually perceivable, which has been the case for all solid state designs done up till now.

The prior art designs often rely on intelligent SW control for timing. The power up/down signal/no signal conditions must be under SW control to avoid pop/click and even worse to avoid stressing the solid state circuit (in some cases). This is a major weakness and might result in that SW errors cause defects in the HW.

As mentioned, the different solutions known in the prior art typically suffer from a remaining pop/click which is a little too significant at least for really high quality perception. There is therefore a need for a solution that reduces the remaining pop/click to an acceptable level for residual noise in high quality products like B&O (Bang & Olufsen) equipment. The most used solution today is to break the ground connection when not BTL (Bridge Tied Load). However, there is no generic solution for the two modes.

Thus, there is furthermore a need for a solution that is generic and can be used in ground wire break, hot wire break and BTL (Bridge Tied Load) mode break.

There have been some attempts to alleviate some of the above-discussed drawbacks in solid state relays, an example of this can be found in U.S. Pat. No. 4,682,061 which discloses a MOSFET switch control. The design presented in U.S. Pat. No. 4,682,061 described a balanced control circuit in the form of two current generators that outbalance each other. The current generators are realized by means of diodes which are known to act as voltage independent current generators when applied with reverse voltage. However, a solution of this type is very sensitive to tolerances of the diodes, which inherently can be very sensitive to temperature and voltage variations. Moreover, matching diodes in order to provide matched current sources is extremely difficult and it is not uncommon that variations in leakage current can differ by a factor of 1000, thus making it more or less impossible to control the time constants which are dependent on the leakage currents. Moreover, the use of an opto-coupled transistor in order to control the time constant of the "mute" is a rather costly solution.

Accordingly, there is a need for a cost-efficient and robust circuit design that takes care of the problems mentioned above and comes up with a sort of generic solution that can also be used in other applications than the ones we see today.

SUMMARY

It is therefore an object of the present invention to provide a system for an audio amplifier assembly which alleviates all or at least some of the above-discussed drawbacks of the presently known systems.

This object is achieved by means of a solid state relay and a method for controlling a signal path between an AC-signal (Alternating Current Signal) output and a load in a power amplifier assembly as defined in the appended claims.

According to a first aspect of the present invention, there is provided a solid state relay for controlling a signal path between an AC-signal output and a load in a power amplifier assembly, wherein the relay comprises a first MOSFET and a second MOSFET, wherein a source terminal of the first MOSFET is connected to a source terminal of the second MOSFET, thereby forming a source junction, wherein a gate terminal of the first MOSFET is connected to a gate terminal of the second MOSFET, thereby forming a gate junction; and wherein a drain terminal of the first MOSFET and a drain terminal of the second MOSFET form relay terminals. The relay further comprises a control circuit including a positive side comprising a controlled current generator configured to provide a first control current to the gate junction from a first voltage source for actuating the MOSFETs and thereby to control the signal path; and a negative side comprising a current mirror circuit configured to sink a second current from the source junction.

Hereby a robust and cost-efficient solid state relay is provided, with high tolerances. Controlling a signal path in this context is to be understood as to switch an AC-signal on/off in the signal path. In other words, to provide a bi-directional switch in said signal path, such as, e.g. for "muting-action" in an audio system. Moreover, the solid state relay according to the first aspect is very effective in avoiding plops/noise when enabling an amplifier when going from "off to on" and from "on to off". Primarily this is obtained by the control circuit that all current delivered to the switching circuit is of removed, such that no "ghost current" is left as a noisy signal.

The first control current creates a first gate source voltage that forces the two semiconductors (MOSFETs) to switch into an on state to act as an active relay state, and simultaneously a second controlled current generator (the current mirror) is sinking current out of the common sources, the second current generator sinking current. Moreover, the present invention is based on the realization that, by using open collectors, the control circuit tolerances are transferred to resistors and thereby it is to a great degree independent of tolerances in the semiconductors. Further, by providing a control circuit operational simply by controlling the matched controlled current generator and current mirror, the control circuit is made rather cost-efficient (most expensive components are the MOSFETs), unlike solutions utilizing e.g. an optocoupled transistor. Even further, the need for a protective zener diode between the gate junction and the source junction is diminished since the control current is well-controlled.

In one exemplary embodiment the first voltage source has a higher voltage level than the AC-signal intended to be controlled by the solid state relay. Accordingly, it can also be said that the first voltage source has a higher voltage level than the signal which is the target to be switched off.

In another exemplary embodiment the current mirror circuit is connected to a second voltage source having a lower voltage level than the AC-signal intended to be controlled by said solid state relay, and wherein the current mirror circuit is configured to sink the second current from the source junction to the second voltage source. Accordingly, it can also be said that the second voltage source has a lower voltage level than the signal which is the target to be switched off.

Moreover, the present invention allows for the power supply of the switching arrangement (power amplifier assembly) to be the same as the power supply for the amplifier. In other words, in yet another exemplary embodiment, the first voltage source comprises (or is formed by) a positive rail of a power supply of the power amplifier assembly, and the second voltage source comprises (or is formed by) a negative rail of the power supply.

According to another aspect of the present invention there is provided a method for controlling a signal path between an AC-signal output and a load in a power amplifier assembly, the method comprising:

providing a pair of MOSFETs having a common gate junction, a common source junction and wherein and wherein a drain terminal of a first MOSFET and a drain terminal of a second MOSFET form relay terminals;

supplying a control current to the gate junction in order to actuate the pair of MOSFETs and thereby control the signal path; and sinking a second current from the source junction via a current mirror connected to the source junction. It could also in some contexts be seen as if the second current is sunk into a current mirror.

With this aspect of the present invention, similar advantages and preferred features are present as in the previously discussed first aspect of the invention.

These and other features of the present invention will in the following be further clarified with reference to the embodiments described hereinafter.

BRIEF DESCRIPTION OF THE DRAWINGS

For exemplifying purposes, the invention will be described in closer detail in the following with reference to embodiments thereof illustrated in the attached drawings, wherein:

FIG. 2b shows a graph with the resulting current signal of the solid state relay illustrated in FIG. 2a.

FIG. 3b shows a graph with the resulting current signal of the solid state relay illustrated in FIG. 3a.

DETAILED DESCRIPTION

In the following detailed description, some embodiments of the present invention will be described. However, it is to be understood that features of the different embodiments are exchangeable between the embodiments and may be combined in different ways, unless anything else is specifically indicated. Even though in the following description, numerous specific details are set forth to provide a more thorough understanding of the present invention, it will be apparent to one skilled in the art that the present invention may be practiced without these specific details. In other instances, well known constructions or functions are not described in detail, so as not to obscure the present invention.

Figure 1:
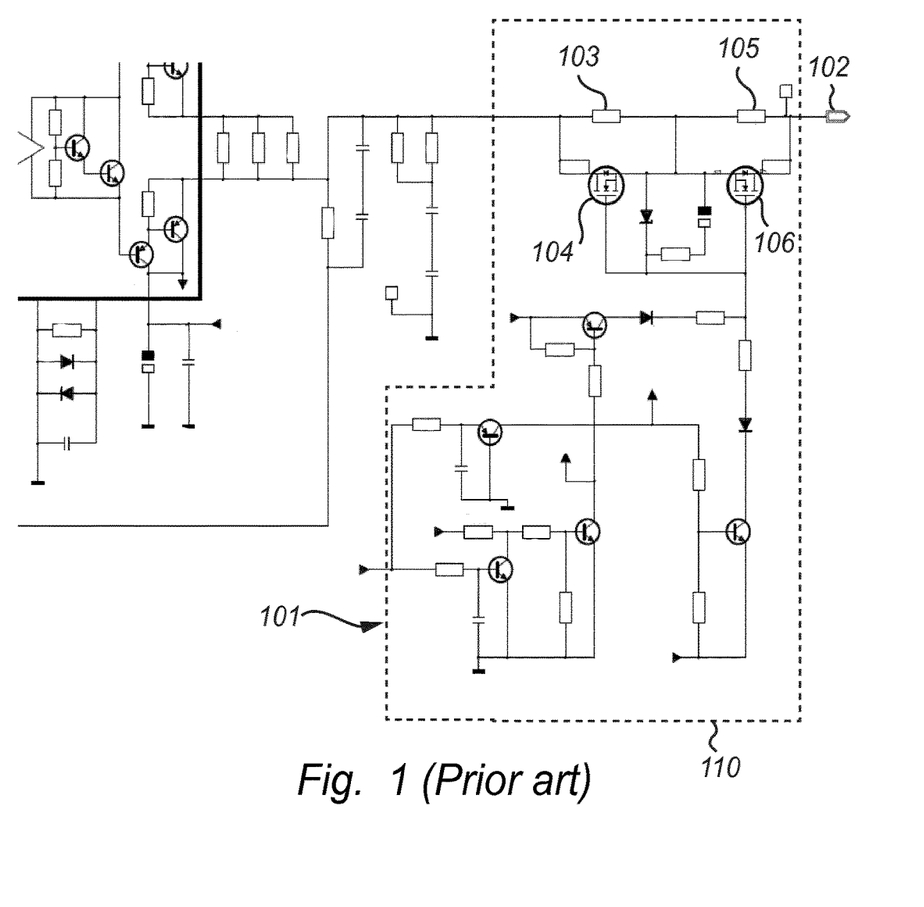
FIG. 1 shows a prior art example which illustrates a schematic drawing of a solid state relay used with a hybrid amplifier.

FIG. 1 illustrates an example of a solid state relay utilizing n-channel MOSFETs 104, 106 as known in the art. A control current generated in the solid state relay 110 passes through the two identical resistors 103, 105. This current is alien in the signal path and results in pop/click at the output 102. Furthermore, the MOS-FETs 104, 106 are oftentimes chosen so that $V_{DS,\ MAX}$ (maximum voltage across the drain and source terminal) is smaller than the supply voltage. This means if the associated amplifier swings to the supply while the control circuit is in a muted state, i.e. while the MOS-FETs 104, 106 are OFF, one MOSFET may be forced into avalanche and might be hurt.

The pop/click coming from the amplifier is limited by two times the resistance of each resistor 103, 105 (e.g. 1 kΩ). If the amplifier swings to full range the residual pop/click will be rather annoying so the raw amplifier itself must perform pretty well regarding pop/click as the mute performance of the solid state relay 110 is rather limited.

Figure 2A:
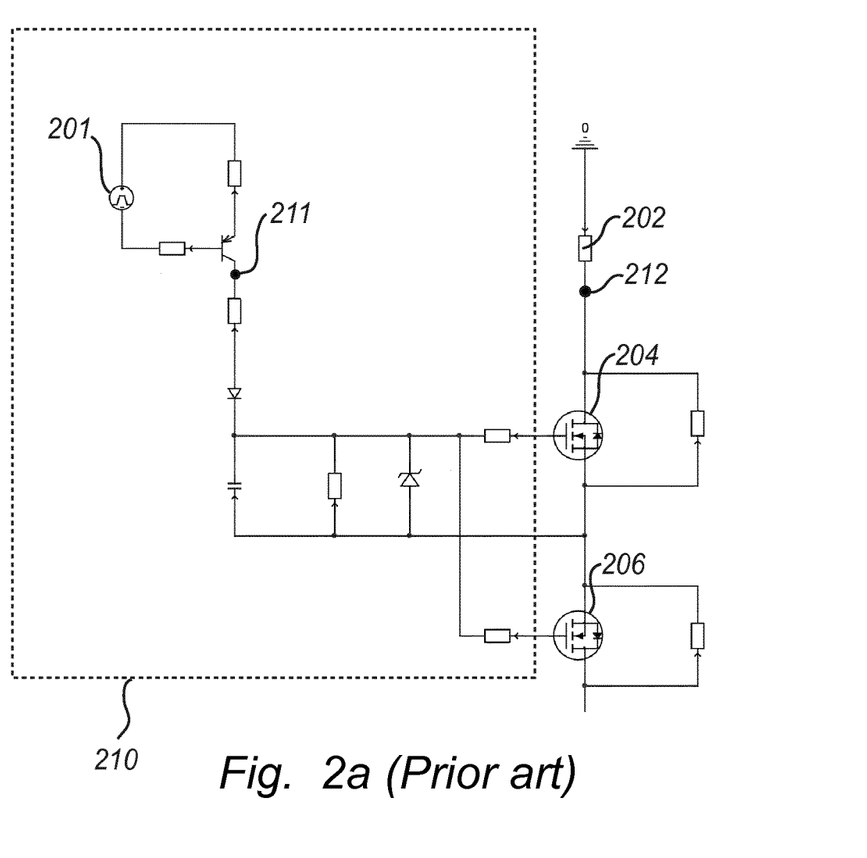
FIG. 2a shows another prior art example which illustrates a rough schematic drawing of a solid state relay.

A more general prior art realization of a solid state relay for audio implementations can be seen in FIG. 2a. A speaker is indicated by the load 202. A current generator 201 supplies a current which drives the gate circuit 210. This current must return to the power supply 201 somehow. The most low impedance branch is through the bottom (in reference to the layout presented in the figure) MOSFET 206 if it is switched on. If the two MOSFETs 104, 106 are exactly the same, the simulated current signals at two points 211, 212 in the circuit are presented in FIG. 2b.

Figure 2B:
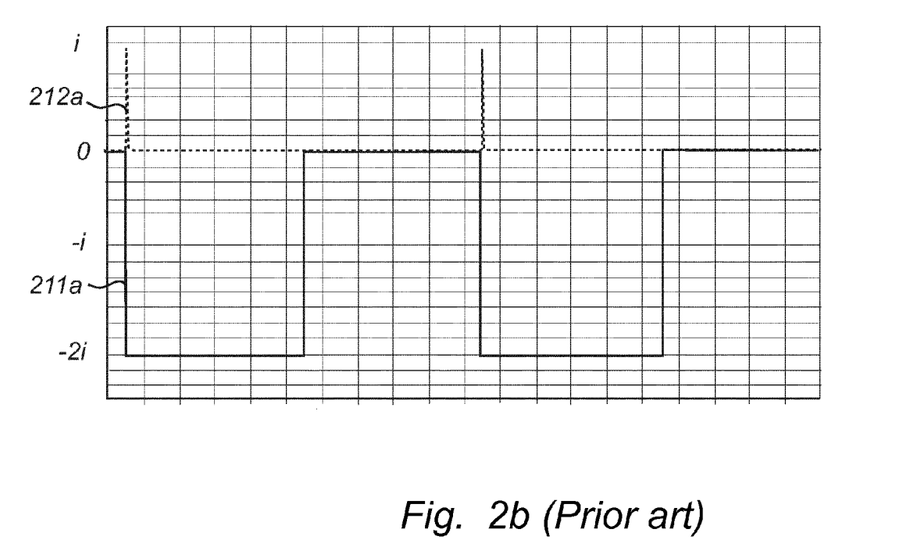

FIG. 2b illustrates the generated current signal 211a (solid line) and the current signal 212a (dashed line) passing through the speaker 202 in the circuit presented in FIG. 2a, where the y-axis and the x-axis indicate current and time respectively. During charge up, half of the current passes through the speaker, as indicated by signal 212a. The opposite will occur if we discharge using an unbalanced source.

Figure 3A:
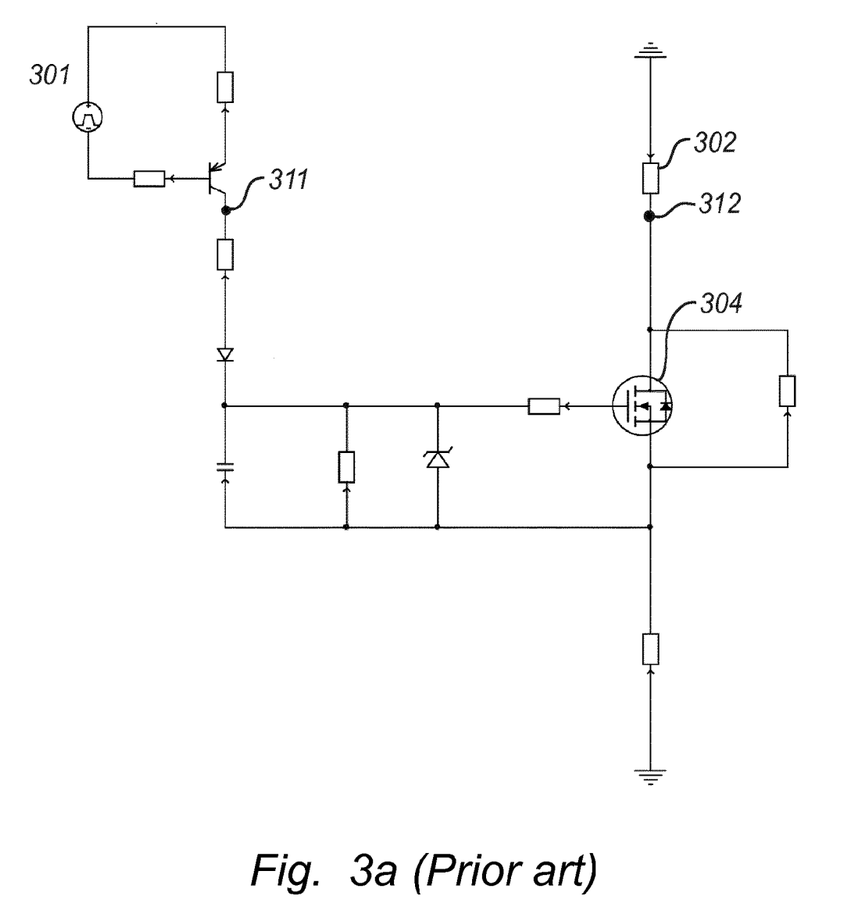
FIG. 3a shows another prior art example which illustrates a rough schematic drawing of the solid state relay from FIG. 2a in an exemplary situation.
Figure 3B:
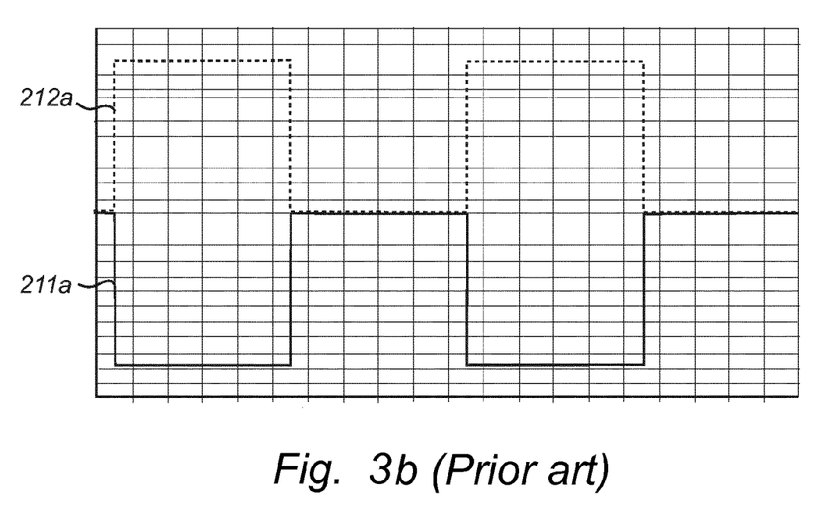

FIG. 3a illustrates a scenario where the bottom MOSFET 206 is "late" because of tolerances in the $V_{GS}$ (gate-source voltage) threshold. A worst case situation can be understood if we simulate completely without the bottom MOSFET 206, as indicated in the circuit presented in FIG. 3a. The resulting simulation of the circuit in FIG. 3a is shown in FIG. 3b. The simulation parameters and "measurement points 211, 212" are chosen to be the same as in the previous example in reference to FIG. 2a and FIG. 2b.

As illustrated in FIG. 3b, all of the control current passes through the speaker 202, according to the circuit design in FIG. 3a. In reality the resulting signals would probably be something in between these two results (FIG. 2b and FIG. 3b).

Figure 4A:
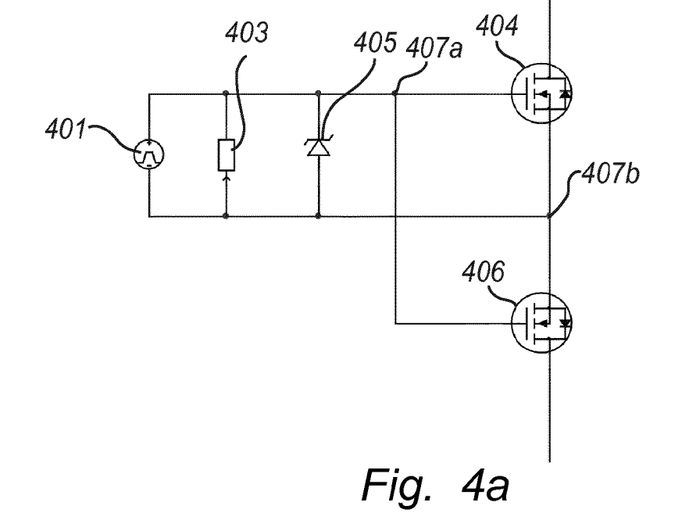
FIG. 4a shows a rough schematic drawing of a solid state relay in accordance with an embodiment of the present invention.
Figure 4B:
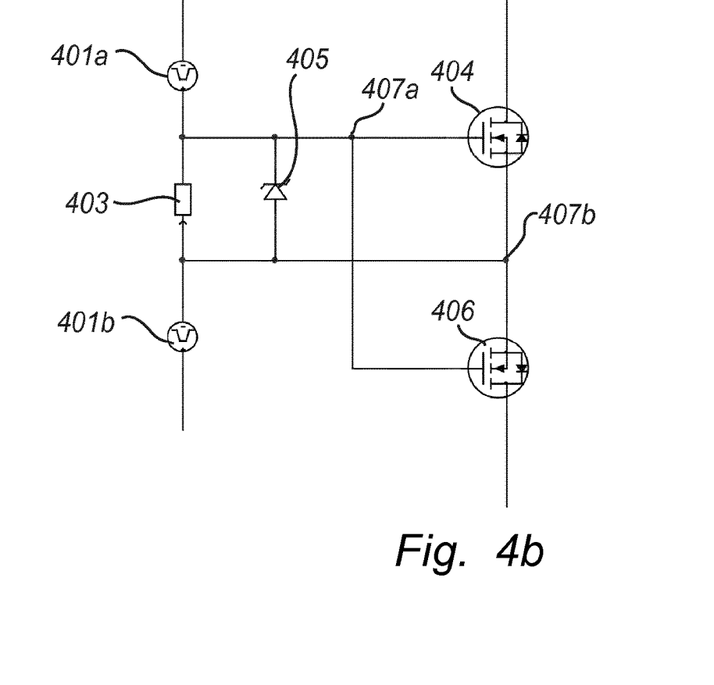
FIG. 4b shows a rough schematic drawing of a solid state relay in accordance with another embodiment of the present invention.

The underlying concept of the operation of the solution provided by the present invention is illustrated in FIG. 4a and FIG. 4b.

FIG. 4a illustrates a schematic illustration of an exemplary embodiment of the present invention. In the figure a current source 401 delivers the needed control current (to the gate junction 407a) for switching the MOSFETs 404, 406 on. Clearly no control current can run between the source terminals of the MOSFETs 404, 406, the control current is instead pulled out from the source junction 407b back to the current/signal generator 401, so no noisy pop/click can occur in a connected speaker (not shown). The resistor 405 serves to control the voltage $V_{GS}$, in more detail it serves to control the time-constants and to discharge the $V_{GS}$ in the mute/off state, i.e. when the MOSTFETs 404, 406 are switched off. The zener diode 406 is an additional safety measurement serving as back-up for the resistor 405 in case an error occurs in the current control circuit. Moreover the zener diode 406 may be used to change the de-mute/mute (on/off) time constants, e.g. if the current generator 401 would supply twice the voltage needed to turn on the MOSFETs 404, 406 as controlled by the resistance 405. This way a de-mute (turn on) time constant of half the mute (turn off) constant may be achieved.

FIG. 4b serves to illustrate that the current source (401 in FIG. 4a) can be divided into two 401a, 401b and be moved to the supply wires acting exactly the same way as the single source 401. Other components and their functions are analogous to the circuit in FIG. 4a.

Figure 5:
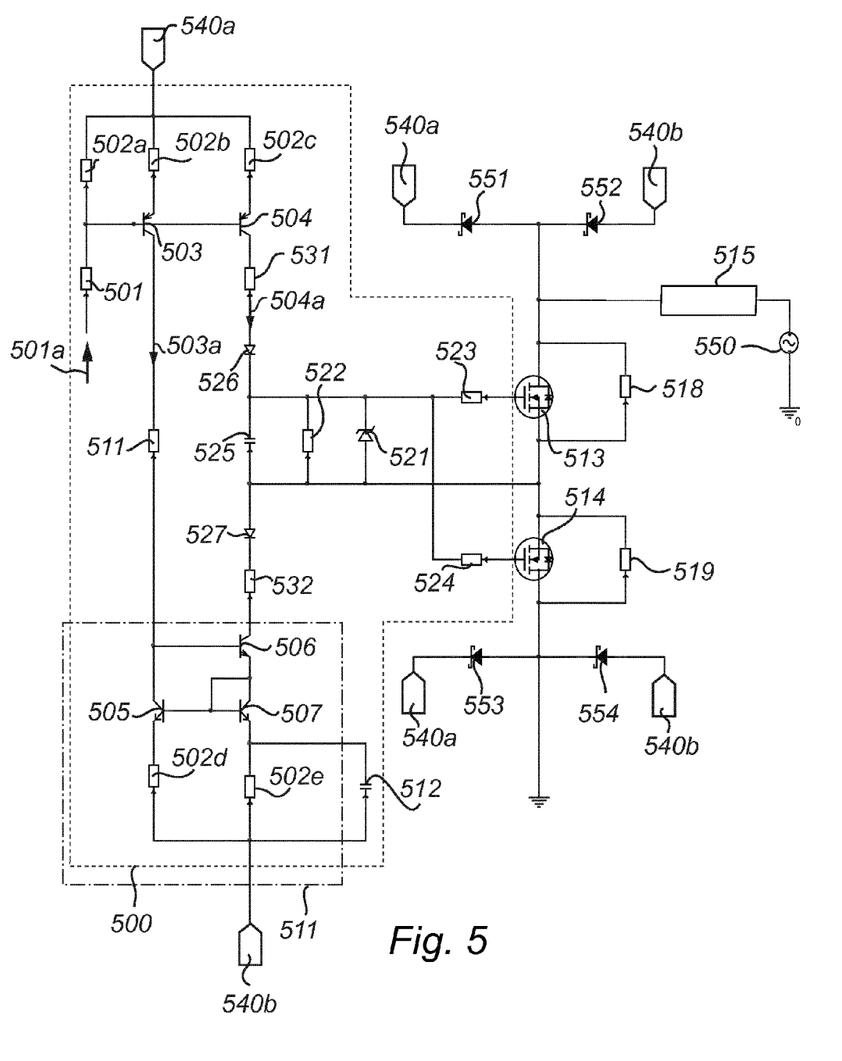
FIG. 5 shows a schematic drawing of a solid state relay in an audio amplifier circuit in accordance with yet another embodiment of the present invention.

FIG. 5 shows a control circuit 500 in accordance with an exemplary embodiment of the invention. The control circuit 500 may be seen as a practical realization of a circuit performing the concept shown in FIGS. 4a and 4b. Specific values are given to certain currents, resistances and voltages in order to further elucidate the inventive concept, this should however not be considered limiting, and the skilled artisan readily understands that the values given may be any other values depending on the intended application.

The relay function is switched on by pulling out a well-controlled current of 110 µA through the resistor 501, i.e. the control input or control current. This can for example be done by means of a transistor and a zener diode (not shown), as known in the art. The topology is chosen so the relay is switched off initially and stays off until energy is applied to the input control circuit under the presence of supply voltage. It's applicable to use the same supply voltage as the power amplifier. Thus, a positive supply rail 540a of the power amplifier may be connected to a common node of the top 3 resistors (502a, 502b, 502c). For the sake of brevity, the power amplifier assembly is in this schematic drawing represented by the signal generator 550 in order to elucidate the operation of the relay circuit, i.e. to control a sinusoidal signal across a load 515. However, the skilled artisan readily understands how a relay circuit would be implemented in an audio amplifier assembly, in accordance with the inventive concept.

This 110 µA current generates a voltage across a resistor 502 of 5.2 V. By means of a transistor 504 this voltage is transferred to a current 504a of 460 µA. Next, a precise copy of this current 504a is to be made and sunk on the negative side 511. The current is monitored by a transistor 503 and transmitted, as indicated by 503a, to the Wilson current mirror formed by transistors 505-507. Other current mirror configurations may alternatively be used, e.g. a Widlar current mirror. However, the Wilson current mirror is preferable in terms of precision/accuracy.

In some situations, there can be rather big differences in the Early voltage on these NPN 505-507 and PNP high voltage transistors 503-504. By having transistor 506 with a higher early voltage than transistors 503, 504 (e.g. −21 V versus −161 V), then the complete control circuit 500 can be adjusted (fine-tuned) to zero balance by trimming the direct current (DC) through the monitor chain (503-511-505). Now a copy of the current 504a 460 uA is pulled out by the transistor 506 so the control circuit 500 is in balance.

Unfortunately the transmission from the positive rail 540a to the negative rail 540b takes some time. This delay will result in a small unbalance as the positive current generator current 504a only can disappear through the speaker 515 and/or ground. The energy in this error is so small that it hardly can be heard, but it can be measured and it is observed in simulations. This error is removed (nominal only) by adding a capacitor 512 on the negative side. The capacitor 512 may not remove the time difference but it generates an equal opposite current injection on the negative rail as on the positive but a little later (far below 1 us). So the sum becomes zero. The result is a single positive/negative current swing around a few MHz which will have no audible effect. This happens during mute as well as un-mute (or de-mute), i.e. during the turning off and on of the MOSFETs 513, 514. The MOSFETs are illustrated as N-channel MOSFETs in this particular exemplary embodiment together with their inherited diode as indicated in the figure; however P-channel MOSFETs may alternatively be used.

An advantage of this drive circuit is that we are rather independent of the MOSFETs 513, 514. So even if the MOSFETs 513, 514 vary by differences in capacitances and/or threshold voltages (in comparison to each other) this will have no effect in the pop/click noise transferred from the control circuit 500. The only performance coming from the MOSFETs 513, 514 is their on-resistance resulting in heat, distortion and reduced damping (output resistance) and unbalance in capacitances resulting in distortion during the transition between mute/un-mute.

References 551, 552, 553 and 554 are Schottky diodes placed to handle inductive currents from the speaker 515 that might stress (Avalanche break down) the MOSFETs 513, 514 during mute (i.e. when the MOSFETs are off) with signal appearance.

The bottom (in reference to the illustrated layout) Schottky diodes 553, 554 are optional for BTL operation or breaking the hot side of the amplifier.

The design may further comprise two resistors 518, 519 connected over the MOSFETs 513, 514, i.e. each resistor between the source and drain of each MOSFET. The job is to discharge the $V_{DS}$ (drain-source voltage). An exemplary scenario may be that the mute action happens while output is negative −60 V. Now the bottom MOSFET 514 will end up being charged to 60 V across its drain and source terminals. A later un-mute will transfer this energy to a pop/click if there are no resistors present. The values of the resistors 518, 519 are to be chosen not to diminish the muting action obtained by the MOSFETs 513, 514 themselves too much. The resistances 518, 519 can generally be increased up to 1 MΩ (mega ohm), for e.g. a IRF540N HEXFET Power MOSFET, for further reduction in mute action, then the MOSFETs 513, 514 take over. This is due to the drain-source capacity present in the MOSFETs 513, 514 in the off-state, which can be seen as an impedance that decreases with frequency. This impedance limits the reduction of the audio-signal intended to be "muted". Thus, if the two resistors 518, 519 across the MOSFETs 513, 514 would have a much higher value than the residual impedance of the MOSFETs 513, 514 then there would be no beneficial audio signal reduction. If the output from the amplifier swings to ±60V the resultant current in the speaker will be limited by the two resistors 518, 519 that are connected over the MOSFETs 513, 514. The resistor 523, 524 connected to the gates of each MOSFET 513, 514 are there to remove parasitic oscillation in switching.

The diode 521 is placed to increase robustness against handling and measurement. Basically the voltage across the resistor 522 is determined by the input control current and the circuit will function without the diode 521 anyway.

$V_{GS}$ is activated by the current generators which send 460 uA which would create 15V. This is limited to 13V by the (zener) diode 521. This way mute and de-mute takes nearly the same time. It is possible to make the time-constants different. Imagine if the resistor 522 is three times higher. Now the discharge of the capacitor 525 is increased by a factor of 3, but the charge is controlled by the 460 uA and therefore unchanged. Thereby, mute action can be made softer (slower).

The capacitor 525 is chosen so small that it makes nearly no delay in the mute process. When used for breaking the ground connection the capacitor 525 can be chosen to 100 pF, but optionally the capacitor 525 can be chosen to be much bigger (i.e. having a larger capacitance).

This could be the case if the amplifier has so much DC offset that we want to soften the mute action in order to make it acceptable. Another reason for using a big capacitor 525 is when used in BTL or hot wire break. In the illustrated design, a big capacitance acts in conjunction with the diodes 526, 527 connected to each side of the capacitor 525 to boot strap the control voltage beyond the limit of the supply voltage. Moreover, the capacitor 525 is often chosen in accordance with the low frequency bandwidth.

The resistors 531, 532 are chosen to increase robustness. They have no operating action in the circuitry. The figure further shows a set of scaling resistors 502*a-e* which are used to set the current magnitudes in the current generating part of the control circuit 500.

The invention has mainly been described above with reference to a few embodiments. However, as is readily appreciated by a person skilled in the art, other embodiments than the ones disclosed above are equally possible within the scope of the invention, as defined by the appended claims. In the claims, any reference signs placed between parentheses shall not be construed as limiting to the claim. The word "comprising" does not exclude the presence of other elements or steps than those listed in the claim. The word "a" or "an" preceding an element does not exclude the presence of a plurality of such elements.

The invention claimed is:

1. A solid state relay for controlling a signal path between an AC-signal output and a load in a power amplifier assembly, said relay comprising:

a first MOSFET and a second MOSFET, wherein a source terminal of the first MOSFET is connected to a source terminal of the second MOSFET, thereby forming a source junction, wherein a gate terminal of the first MOSFET is connected to a gate terminal of the second MOSFET, thereby forming a gate junction, and wherein a drain terminal of the first MOSFET and a drain terminal of the second MOSFET form relay terminals; and a control circuit including:

a positive side comprising a controlled current generator configured to provide a first control current to the gate junction from a first voltage source for actuating the MOSFETs and thereby to control said signal path; and a negative side comprising a current mirror connected to a second voltage source having a lower voltage level than the AC-signal intended to be controlled by said solid state relay, wherein the current mirror is configured to sink a second current from the source junction to the second voltage source, wherein the negative side further comprises a capacitor connected between the current mirror and the second voltage sources;

wherein the current mirror is a Wilson current mirror.

2. The solid state relay according to claim 1, wherein said first voltage source has a higher voltage level than the AC-signal intended to be controlled by said solid state relay.

3. The solid state relay according to claim 1, wherein said first voltage source comprises a positive rail of a power supply of the power amplifier assembly, and wherein the second voltage source comprises a negative rail of the power supply.

4. The solid state relay according to claim 1, wherein each MOSFET is an N-channel MOSFET.

5. A method for controlling a signal path between an AC-signal output and a load in a power amplifier assembly, said signal path including a pair of MOSFETs having a common gate junction, a common source junction and wherein a drain terminal of a first MOSFET and a drain terminal of a second MOSFET form relay terminals, said method comprising:

on a positive side, supplying a control current from a first voltage source to said gate junction in order to actuate said pair of MOSFETs and thereby control said signal path;

on a negative side, sinking a second current from the source junction to a second voltage source via a current mirror connected to said source junction; and during turning on or turning off said MOSFETs, generating a current injection by means of a capacitor connected between the current mirror and the second voltage source;

wherein the current mirror is a Wilson current mirror circuit.

* * * * *